US008717035B2

(12) United States Patent
Shook et al.

(10) Patent No.: US 8,717,035 B2
(45) Date of Patent: May 6, 2014

(54) SYSTEMS AND METHODS FOR DETECTING AN OPEN CELL TAP IN A BATTERY PACK

(75) Inventors: Christopher W. Shook, Bel Air, MD (US); Steven J. Phillips, Ellicott City, MD (US)

(73) Assignee: Black & Decker Inc., Newark, DE (US)

( * ) Notice: Subject to any disclaimer, the term of this patent is extended or adjusted under 35 U.S.C. 154(b) by 318 days.

(21) Appl. No.: 12/961,685

(22) Filed: Dec. 7, 2010

(65) Prior Publication Data

US 2011/0148425 A1 Jun. 23, 2011

Related U.S. Application Data

(60) Provisional application No. 61/289,713, filed on Dec. 23, 2009.

(51) Int. Cl.
 *G01N 27/416* (2006.01)
(52) U.S. Cl.
 USPC .......................................... 324/433; 320/162
(58) Field of Classification Search
 USPC .......................... 320/116–123; 324/427–436
 See application file for complete search history.

(56) References Cited

U.S. PATENT DOCUMENTS

2009/0051324 A1 * 2/2009 Nakatsuji ...................... 320/134

FOREIGN PATENT DOCUMENTS

| JP | 10150721 A * | 6/1998 |
| JP | 2004180395 A * | 6/2004 |
| WO | WO 2007119682 A1 * | 10/2007 |

* cited by examiner

*Primary Examiner* — Melissa Koval
*Assistant Examiner* — Daniel Miller
(74) *Attorney, Agent, or Firm* — Harness, Dickey & Pierce, P.L.C.

(57) ABSTRACT

A method is provided for detecting an open cell tap condition in a battery pack. The method includes: applying a detection voltage across an electrical impedance that is coupled to a measurement node, where the detection voltage exceeds voltage measures at a node disposed between serially coupled battery cells of the battery pack and the measurement node is coupled by a circuit path to said node; measuring the voltage at the measurement node while the detection voltage is being applied; and detecting a break in the circuit path when the voltage measured at the measurement node is substantially equal to the detection voltage.

12 Claims, 6 Drawing Sheets

SYSTEMS AND METHODS FOR DETECTING AN OPEN CELL TAP IN A BATTERY PACK

CROSS-REFERENCE TO RELATED APPLICATION

This application claims the benefit of U.S. Provisional Application No. 61/289,713, filed on Dec. 23, 2009. The entire disclosure of the above application is incorporated herein by reference.

FIELD

The present disclosure relates to systems and methods for monitoring parameters of a battery pack, and more particularly to detecting an open tap between cells of the battery pack.

BACKGROUND

Rechargeable battery packs (hereinafter "battery packs") are used in portable devices such as laptop computers, cordless power tools, etc. Battery packs typically include more than one battery cell in order to provide a desired voltage. Parameters of individual battery cells in a battery pack are monitored while the battery pack is charging. For example, voltages across individual battery cells may be monitored at taps between the individual battery cells. A battery cell may be damaged when the battery cell is charged to a voltage above a normal operating voltage (i.e., overcharged). Accordingly, it is desirable to measure voltages at taps between battery cells to determine whether an individual cell is being overcharged while a battery pack is charging.

Taps between battery cells may become defective and disconnect from the battery cells. Voltage across a battery cell may not be monitored when a tap is disconnected or otherwise damaged. Accordingly, overcharging of the battery cell may not be detected when a tap associated with the battery cell is disconnected from the battery cell. It is therefore desirable to detect when a tap is disconnected from a battery cell while charging a battery pack.

The background description provided herein is for the purpose of generally presenting the context of the disclosure.

SUMMARY

A method is provided for detecting an open cell tap condition in a battery pack. The method includes: applying a detection voltage across an electrical impedance that is coupled to a measurement node, where the detection voltage exceeds voltage measures at a node disposed between serially coupled battery cells of the battery pack and the measurement node is coupled by a circuit path to said node; measuring the voltage at the measurement node while the detection voltage is being applied; and detecting a break in the circuit path when the voltage measured at the measurement node is substantially equal to the detection voltage.

The method for detecting open cell tap conditions may be implemented by a battery pack charger. The charger detects whether a terminal of the charger is disconnected from a first node between cells of a battery pack docked in the charger. The charger is comprised of: a first resistor connected to the terminal; a second resistor connected in series with the first resistor; a switch connected to a positive supply terminal of the battery pack, wherein the switch is connected in series with the first and second resistors; and a threshold determination module that measures a voltage at a second node between the first and second resistors and determines that the terminal of the charger is disconnected from the first node between the cells of the battery pack when the switch is closed and the voltage is greater than a threshold voltage.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The present disclosure will become more fully understood from the detailed description and the accompanying drawings, wherein.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Systems and methods according to the present disclosure monitor parameters of battery cells in a battery pack while the battery pack is charging. The systems and methods detect both overcharging of battery cells and disconnected taps using a detection module and an arrangement of discrete components (e.g., resistors and switches). The detection module alternates between an overcharge detection mode and an open tap detection mode. The detection module detects whether a battery cell is overcharging when operating in the overcharge detection mode and determines whether a tap is disconnected from a battery cell when operating in the open tap detection mode.

In the overcharge detection mode, the detection module measures voltages across each of the battery cells. The detection module determines that a battery cell is overcharging when one of the measured voltages is greater than a threshold voltage of the cell.

The detection module modifies electrical connections of the discrete components to transition from the overcharge detection mode to the open tap detection mode. For example, the detection module may close a switch to connect a tap to a positive terminal of the battery pack through a resistor. The detection module may then measure a voltage at the tap and determine that the tap is disconnected from a battery cell when the voltage at the tap is pulled away from a typical tap voltage towards the positive terminal voltage of the battery pack.

Figure 1:
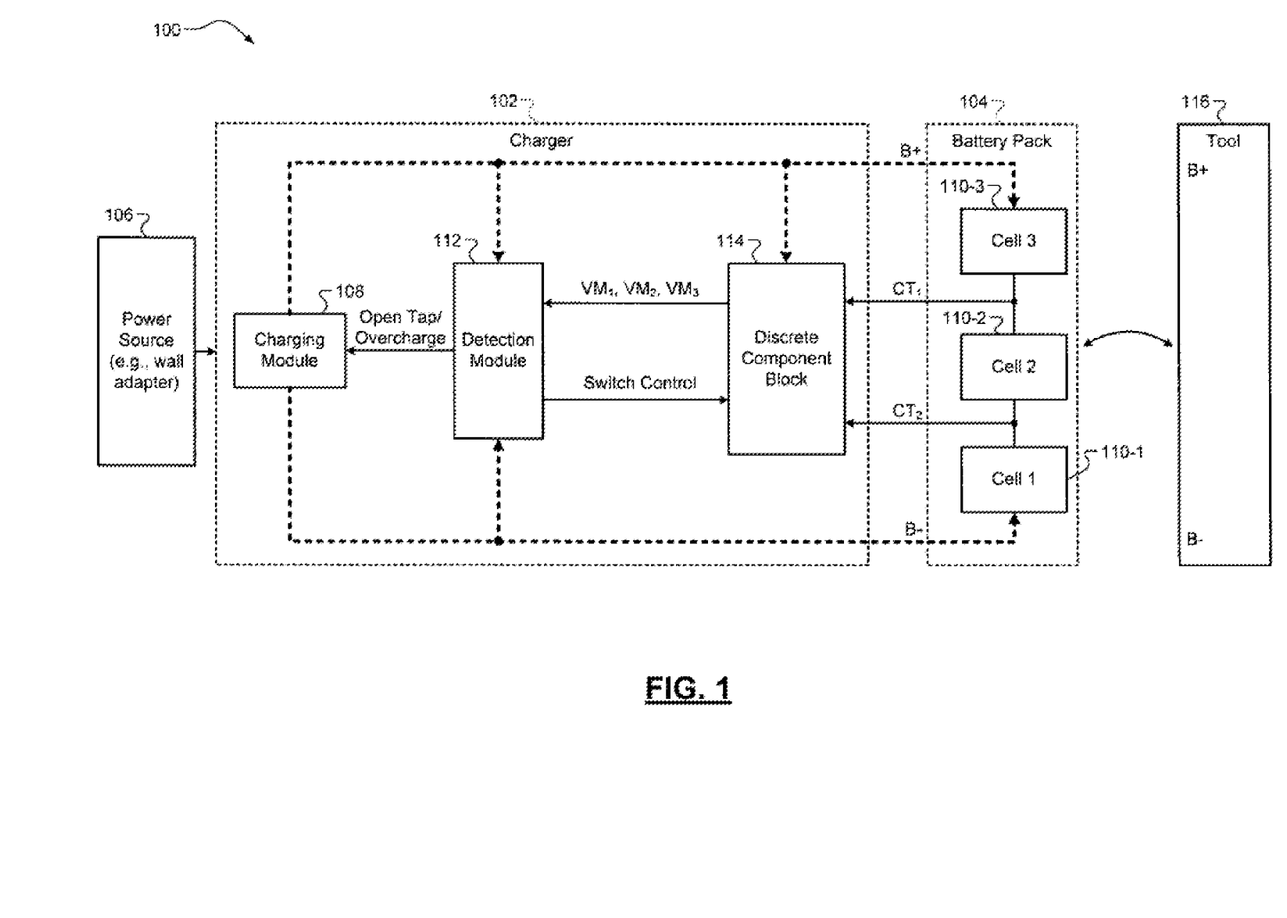
FIG. 1 illustrates a battery pack charging system according to the present disclosure.

FIG. 1 shows a battery pack charging system 100. The battery pack charging system 100 includes a charger 102 that charges a battery pack 104. A user places the battery pack 104 in the charger 102 to recharge the battery pack 104. The charger 102 receives power from a power source 106. For example, the power source 106 may be a wall adapter that receives alternating current (AC) power (e.g., at 120V/60 Hz) and outputs DC power (e.g., at greater than 12V).

The charger 102 includes a charging module 108. The charging module 108 supplies power to the battery pack 104 to charge the battery pack 104. The battery pack 104 is connected to the charging module 108 at B+ and B− terminals. The battery pack 104 includes three cells 110-1, 110-2, and 110-3 (collectively "cells 110"). While the battery pack 104 of FIG. 1 includes 3 cells 110, the battery pack 104 may include more or less than 3 cells. Each of the cells 110 may be a Li-ion cell. Each of the cells 110 may output approximately 4V. The output voltage of the battery pack (i.e., the voltage difference between B+ and B−) may be approximately three times the voltage output of a single cell 110 (i.e., approximately 12V) since each of the cells 110 are connected in series. While the battery pack 104 is described as a Li-ion battery pack, the systems and methods of the present disclosure may apply to battery packs including other battery chemistries. For example, the systems and methods of the present disclosure may apply to nickel cadmium batteries, nickel metal hydride batteries, etc.

The battery pack 104 includes terminals that are connected to nodes between each of the cells 110. The terminals that are connected to the nodes may be referred to hereinafter as "cell taps." Accordingly, a first cell tap ($CT_1$) is connected to a node between cell 3 110-3 and cell 2 110-2, and a second cell tap ($CT_2$) is connected to a node between cell 2 110-2 and cell 1 110-1.

As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

The charging module 108 may charge the battery pack 104 using a constant current followed by a constant voltage. For example, the charging module 108 may apply a constant charging current until a predetermined voltage per cell 110 is reached. The charging module 108 may then apply a constant voltage to the battery pack 104 until a current applied to the battery pack 104 drops below a predetermined current threshold.

While the charging module 108 is described as charging the battery pack 104 using a constant current followed by a constant voltage, the charging module 108 may apply other charging algorithms to the battery pack 104. The charging algorithm applied by the charging module 108 may depend on the chemistry of the battery pack 104. For example, depending on the chemistry of the battery pack 104, the charging module 108 may supply a constant DC power charge, a trickle charge, a pulse charge, etc.

The charger 102 includes a detection module 112 that determines when an overcharging condition and/or an open tap condition occurs in the battery pack 104. An overcharging condition occurs when one or more cells 110 of the battery pack 104 are charged to greater than a threshold voltage. The threshold voltage may be a voltage that indicates that a cell 110 is overcharging. Accordingly, the threshold voltage is a voltage that is greater than a typical voltage output by a cell 110. For example, for a Li-ion cell, the threshold voltage may be in the range of 4.1-4.2V. Overcharging of the cells 110 may result in damage to the cells 110.

An open tap condition may occur in various ways. In general, an open tap condition occurs when a node between the cells 110 is disconnected from the detection module 112. For example, an open tap condition occurs when one of the cell taps ($CT_1$ or $CT_2$) is disconnected from a node between the cells 110. Additionally, an open tap condition may occur when cell taps on the battery pack 104 and/or the charger 102 are broken or bent inward so that an electrical connection between the battery pack 104 and the charger 102 is not made.

The charger 102 includes a discrete component block 114. The discrete component block 114 represents discrete components (e.g., resistors, transistors, and capacitors) that may be used to connect the detection module 112 to the battery pack 104. While the discrete component block 114 is described as including discrete components, the discrete component block 114 may be replaced by integrated components. For example, the discrete component block 114 may be replaced by resistors, transistors, and capacitors integrated on an integrated circuit.

The detection module 112 controls switches (e.g., transistors) of the discrete component block 114 and measures voltages across the components of the discrete component block 114. The detection module 112 determines whether an overcharging condition and/or an open tap condition exists based on the measured voltages.

The charging module 108 may take remedial action when the detection module 112 detects an overcharging condition or the open tap condition. For example, the charging module 108 may stop charging the battery pack 104 when either the overcharging condition or the open tap condition exists.

The detection module 112 measures the terminal voltages B+ and B− of the battery pack 104 in addition to voltages across the components of the discrete component block 114. The voltages measured by the detection module 112 may be referred to as $VM_1$, $VM_2$, and $VM_3$. The detection module 112 may determine the voltages across each of the cells 110 of the battery pack 104 based on $VM_1$, $VM_2$, and $VM_3$. The detection module 112 detects the overcharging and/or open tap condition based on $VM_1$, $VM_2$, and $VM_3$.

After the battery pack 104 has been sufficiently charged, the battery pack 104 may be disconnected from the charger 102 and used in a tool 116. For example, the tool 116 may include a cordless drill, a cordless brad nailer, a screwdriver, a flashlight, a saw, etc.

Figure 2:
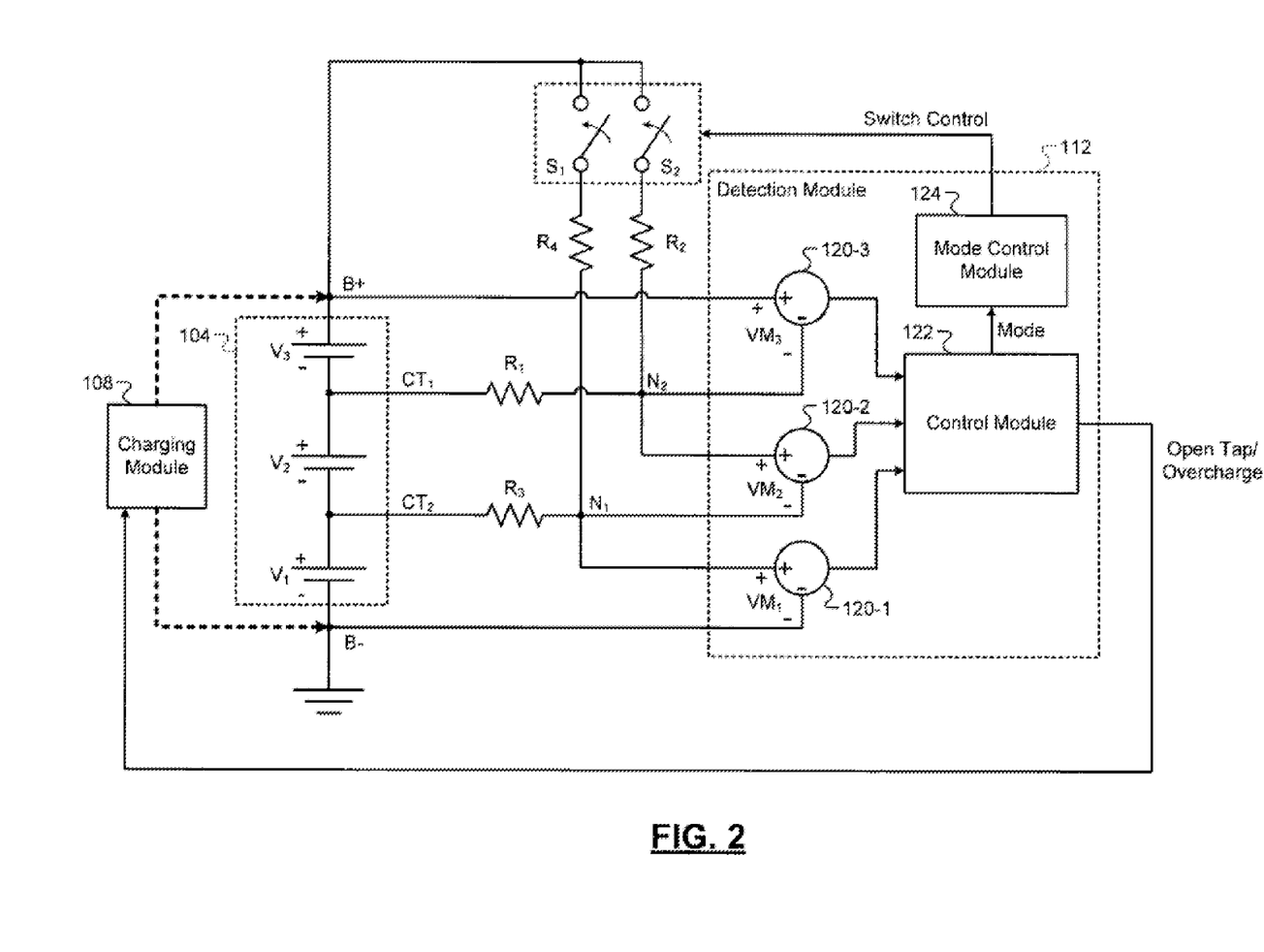
FIG. 2 is a functional block diagram of the battery pack charging system configured to detect an overcharging condition of a battery pack according to the present disclosure.
Figure 4:
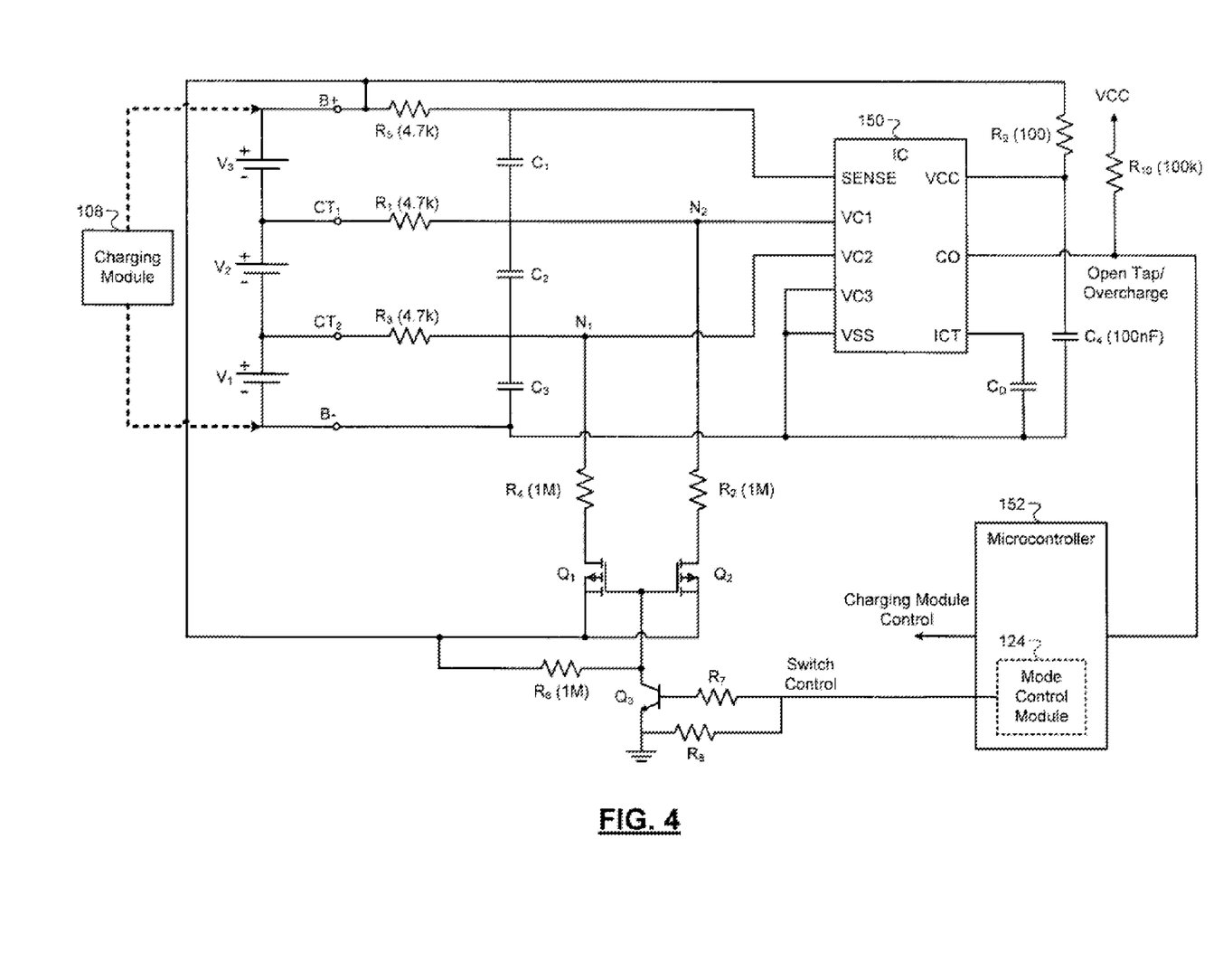
FIG. 4 illustrates a schematic of an exemplary embodiment of the battery pack charging system according to the present disclosure.

An exemplary connection between the detection module 112 and the battery pack 104 is illustrated in FIG. 2. The detection module 112 is connected to the battery pack 104 using discrete components. The discrete components include resistors $R_1$-$R_4$ and switches $S_1$-$S_2$. For example, the switches $S_1$-$S_2$ may be implemented using transistors as shown in FIG. 4. The three cells 110 of the battery pack 104 are represented as voltage sources $V_1$-$V_3$ connected in series.

The detection module 112 includes first, second, and third threshold determination modules 120-1, 120-2, and 120-3 (collectively "threshold determination modules 120"). The threshold determination modules 120 include (+) and (−) terminals. Each of the threshold determination modules 120 determines a voltage difference between the voltages at the (+) and (−) terminals. In order to simplify the explanation of the threshold determination modules 120, it is assumed that the (+) and (−) terminals do not source or sink current. In other words, the (+) and (−) terminals of the threshold determination modules 120 act as open circuits. The voltage differences at the (+) and (−) terminals of the first, second, and third threshold determination modules 120 are denoted as $VM_1$, $VM_2$, and $VM_3$, respectively.

Each of the threshold determination modules 120 operates in a similar manner. In some implementations, the threshold determination modules 120 may have the same functionality. The first threshold determination module 120-1 determines whether voltage $VM_1$ is greater than the threshold voltage. Similarly, the second and third threshold determination modules 120-2, 120-3 determine whether $VM_2$ and $VM_3$, respectively, are greater than the threshold voltage.

While the threshold determination modules 120 are described as comparing respective voltages $VM_1$, $VM_2$, and $VM_3$ to a single threshold voltage, in other implementations, each of the threshold determination modules 120 may include a different threshold voltage. For example, the first, second, and third threshold determination modules 120-1, 120-2, 120-3 may determine whether $VM_1$, $VM_2$, and $VM_3$ are greater than first, second, and third threshold voltages, respectively, where the first, second, and third threshold voltages are different values.

The first threshold determination module 120-1 sends a signal to a control module 122 to indicate when $VM_1$ is greater than the threshold voltage. Similarly, the second and third threshold determination modules 120-2 and 120-3 send signals to the control module 122 to indicate when $VM_2$ and $VM_3$, respectively, are greater than the threshold voltage.

The control module 122 determines which cell 110 of the battery pack 104 is overcharging and/or which cell tap is open based on the signals received from the threshold determination modules 120. The charging module 108 may take remedial action when the control module 122 determines that an overcharging condition and/or an open tap condition exists. For example, the charging module 108 may stop charging the battery pack 104 when an overcharging condition and/or an open tap condition exists.

The control module 122 may select from one of two general modes of operation. The modes of operation are hereinafter referred to as an overcharge detection mode and an open tap detection mode. In the overcharge detection mode, the control module 122 determines whether an overcharging condition exists. In the open tap detection mode, the control module 122 determines whether an open tap condition exists.

A mode control module 124 controls the switches $S_1$ and $S_2$ based on the mode of operation. The mode control module 124 opens switches $S_1$ and $S_2$ when the control module 122 selects the overcharge detection mode. The mode control module 124 closes the switches $S_1$ and $S_2$ when the control module 122 selects the open tap detection mode. The control module 122 may alternate between the overcharge detection mode and the open tap detection mode while the battery pack 104 is being charged. For example, the control module 122 may alternate between the overcharge detection mode and the open tap detection mode at predetermined intervals during charging of the battery pack 104.

In some implementations, the control module 122 starts in the open tap detection mode upon insertion of the battery pack 104 in the charger 102, then transitions to the overcharge detection mode when an open tap condition is not detected. The control module 122 may then stay in the overcharge detection mode while the battery pack 104 is charging, or alternate between the open tap detection mode and the overcharge detection mode to periodically determine whether a node between the cells 110 is disconnected from the detection module 112.

When the control module 122 selects the overcharge detection mode and one or more of the threshold determination modules 120 indicates that the measured voltage is greater than the threshold voltage, the control module 122 determines that the measured voltage is greater than the threshold voltage due to an overcharging condition. When the control module 122 selects the open tap detection mode and one or more of the threshold determination modules 120 indicates that the measured voltage is greater than the threshold voltage, the control module 122 determines that the measured voltage is greater than the threshold voltage due to an open tap condition.

Figure 3:
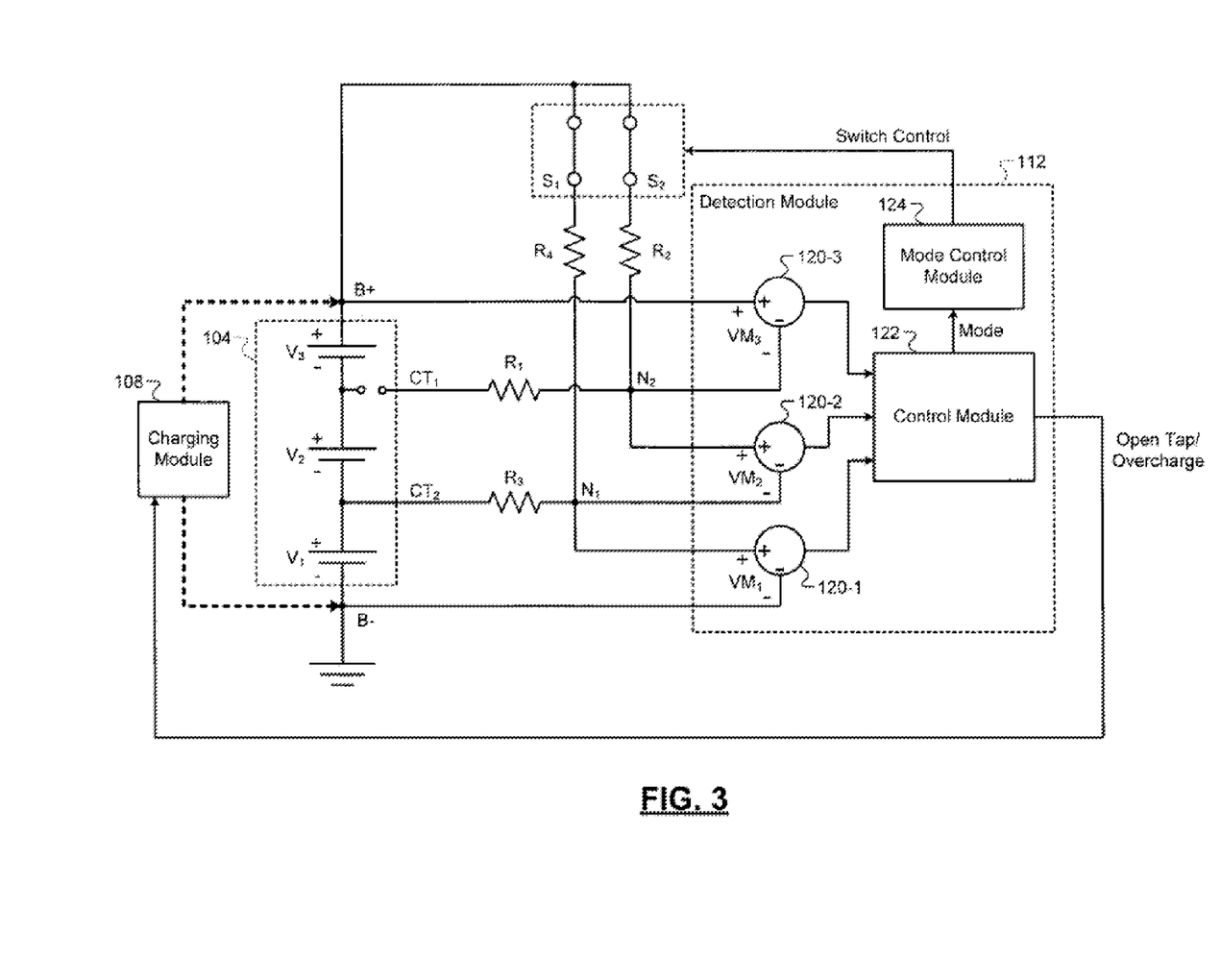
FIG. 3 is a functional block diagram of the battery pack charging system configured to detect an open tap condition of the battery pack according to the present disclosure.

In the exemplary connections between the detection module 112 and the battery pack 104 illustrated in FIGS. 2-3, the mode control module 124 controls the switches $S_1$ and $S_2$ to select whether the control module 122 detects an overcharging condition or an open tap condition. The switches $S_1$ and $S_2$ connect/disconnect resistors $R_4$ and $R_2$ to B+, respectively. $R_4$ and $R_2$ are connected to resistors $R_3$ and $R_1$, respectively, which in turn are connected to $CT_2$ and $CT_1$, respectively.

As discussed above, the threshold determination modules 120 act as open circuits, therefore when switches $S_1$ and $S_2$ are open, current does not flow through $R_1$-$R_4$. Accordingly, the voltages $VM_1$, $VM_2$, and $VM_3$ are equal to $V_1$, $V_2$, and $V_3$, respectively, when the switches $S_1$ and $S_2$ are open.

When the switches $S_1$ and $S_2$ are open, the threshold determination modules 120 measure the voltages $V_1$, $V_2$, and $V_3$ directly, and therefore determine whether the voltages across the cells 110 are greater than the threshold voltage. The control module 122 determines that the overcharging condition exists when the threshold determination modules 120 signal the control module 122 that either $VM_1$, $VM_2$, or $VM_3$ is greater than the threshold voltage. The charging module 108 may stop charging the battery pack 104 when the control module 122 determines that an overcharging condition exists.

Referring now to FIG. 3, the mode control module 124 closes the switches $S_1$ and $S_2$ to select the open tap detection mode. The exemplary embodiment illustrated in FIG. 3 shows an open tap at $CT_1$ while tap $CT_2$ is closed. Accordingly, the detection module 112 detects that $CT_1$ is open and detects that $CT_2$ is closed when the switches $S_1$ and $S_2$ are closed. The detection module 112 detects that $CT_1$ is open based on an increase in the voltage $VM_2$ towards the voltage at B+ of the battery pack 104.

When tap $CT_1$ is open, node $N_2$ is pulled toward B+. The voltage measured at $VM_2$ by the second threshold detection module 120-2 is raised to a value of approximately B+ minus $V_1$. In other words, $VM_2$ is increased to greater than the threshold voltage. Accordingly, the second threshold determination module 120-2 determines that $VM_2$ is greater than the threshold voltage when switch $S_2$ is closed and $CT_1$ is open.

The control module 122 determines that an open tap condition exists when the second threshold determination module 120-2 determines that $VM_2$ is increased to greater than the threshold voltage. The charging module 108 may stop charging the battery pack 104 when the control module 122 determines that the open tap condition exists.

In FIG. 3, resistor $R_4$ is selected to be greater than resistor $R_3$, and resistor $R_2$ is selected to be greater than resistor $R_1$. The resistances $R_2$ and $R_4$ are selected so that nodes $N_2$ and $N_1$ are not increased substantially towards B+ when the switches $S_2$ and $S_1$, respectively, are closed and no open tap condition exists. In other words, the resistances $R_2$ and $R_4$ are selected so that the voltages at the nodes $N_2$ and $N_1$ are not increased to a level where the threshold determination modules 120-1 and 120-2 determine that $VM_1$ and $VM_2$ are greater than the threshold voltage.

More specifically, with reference to $CT_2$, when $R_4$ is substantially larger than $R_3$, the voltage at node $N_1$ may not substantially change when the switch $S_1$ is closed. Node $N_1$ may be at the voltage $V_1$ prior to switch $S_1$ closing. Node $N_1$ may increase towards B+ when the switch $S_1$ is closed, however since $R_4$ is selected to be much greater than $R_3$, node $N_1$ may not increase to a voltage that is greater than the threshold voltage. Accordingly, the first threshold determination module 120-1 may not detect an open tap at $CT_2$ when the detection module 112 is in the open tap detection mode.

While the detection module 112 and the discrete component block 114 are included in the charger 102 in FIG. 1, the detection module 112 and the discrete component block 114 may be separate from the charger 102. For example, the detection module 112 and the discrete component block 114 may be on a printed circuit board that is included in the tool 116.

In some implementations, the detection module 112 may determine when the cells 110 are discharged below a predetermined discharge voltage (e.g., 3V). For example, the threshold determination modules 120 may determine whether $VM_1$, $VM_2$, or $VM_3$ is less than the predetermined discharge voltage in the overcharge detection mode. The threshold determination modules 120 may send a signal to the control module 122 to indicate that the cells 110 are discharged to less than the predetermined discharge voltage.

In some implementations, the tool 116 includes the detection module 112 that detects whether the cells 110 are discharged to less than the predetermined discharge voltage. Accordingly, the control module 122 may stop operation of the tool 116 when the cells 110 are discharged to less than the predetermined discharge voltage.

Referring now to FIG. 4, an exemplary implementation of the system of the present disclosure is illustrated. The implementation includes an integrated circuit IC 150 (hereinafter "IC 150") connected to discrete components (i.e., resistors, capacitors, and transistors). The IC 150 may be a Seiko Instruments Inc. S-8244 Series Battery Protection IC for a 1-Serial to 4-Serial-Cell Pack. Accordingly, a single IC (i.e., the S-8244 Series Battery Protection IC) may be used to detect both an overcharging condition and an open tap condition. Pinouts on the IC 150 include VCC, VSS, SENSE, ICT, CO, and VC1-3. The resistor values, in ohms, are shown in parenthesis.

A cost of implementing the battery pack system 100 may be reduced since a single readily available integrated circuit may be used to detect both an overcharge condition and an open tap condition. While the IC 150 is described as a Seiko Instruments Inc. S-8244 Series Battery Protection IC, the IC 150 may be replaced by other integrated circuits having similar functionality. For example, other integrated circuits capable of indicating when a voltage difference is greater than the threshold voltage may be used in place of the S-8244 IC.

Power is provided to the IC 150 at the positive and negative power supply pins, VCC and VSS, respectively. The resistors $R_1$, $R_3$, and $R_5$ and capacitors $C_1$-$C_3$ act as low pass filters at the input pins SENSE and VC1-VC3 of the IC 150. The input pins SENSE and VC1-VC3 may sink a negligible amount of current and therefore may be described as open circuits for the purpose of analysis.

The IC 150 indicates at the output pin CO whether any of the battery voltages $V_1$-$V_3$ exceeds the threshold voltage for a delay time. More specifically, the IC 150 indicates whether $V_3$ exceeds the threshold voltage based on SENSE-VC1, whether $V_2$ exceeds the threshold voltage based on VC1-VC2, and whether $V_1$ exceeds the threshold voltage based on VC2-VC3. The IC 150 may accommodate detection of whether a fourth voltage exceeds the threshold voltage, however VC3-VSS is shorted in FIG. 4.

CO may be an open drain output stage. The output pin CO may be pulled down to 0V to indicate when the battery voltages $V_1$-$V_3$ are less than the threshold voltage. CO is set to a high state when any of the battery voltages $V_1$-$V_3$ are greater than the threshold voltage for the delay time.

The IC 150 determines the delay time using the ICT pin and the capacitor $C_D$. The IC 150 charges $C_D$ to a first predetermined voltage when any of the battery voltages $V_1$-$V_3$ exceeds the threshold voltage. The IC 150 then discharges $C_D$ at a predetermined current until the voltage across $C_D$ falls below a second predetermined voltage. The amount of time that passes during the discharge of $C_D$ is the delay time. The IC 150 indicates that one of the battery voltages $V_1$-$V_3$ is greater than the threshold voltage when one of the battery voltages is greater than the threshold voltage for the delay time. The IC 150 pulls CO low when the battery voltages decrease below the threshold voltage.

A microcontroller 152 includes the mode control module 124. Accordingly, the microcontroller 152 controls the mode of the system. The mode control module 124 controls the operating point of transistors $Q_1$ and $Q_2$. For example, the mode control module 124 turns on transistor $Q_3$ in order to turn on transistors $Q_1$ and $Q_2$. Transistors $Q_1$ and $Q_2$ may act as short circuits when turned on. Accordingly, $R_2$ and $R_4$ are connected to B+ when the mode control module 124 turns on transistors $Q_1$-$Q_3$. In an alternative arrangement, $R_2$ and $R_4$ may be connected to the filtered input to Vcc of IC 150 or to an otherwise filtered variant of B+, thereby protecting the control circuit from any noise in the B+ signal.

In the overcharge detection mode, the mode control module 124 turns off $Q_1$ and $Q_2$. Accordingly, the IC 150 detects the voltages across the batteries $V_1$-$V_3$ in the overcharge detection mode. In the open tap detection mode, the mode control module 124 turns on $Q_1$ and $Q_2$. $R_2$ and $R_4$ are high valued resistors relative to $R_1$ and $R_3$. Accordingly, during typical operation when an open tap does not exist, the voltages at the nodes $N_1$ and $N_2$ are only slightly raised towards B+ when the mode control module 124 turns on $Q_1$ and $Q_2$. In other words, the node voltages at $N_1$ and $N_2$ are maintained so that the IC 150 does not detect a voltage difference (e.g., VC1-VC2 or VC2-VC3) that is greater than the threshold voltage when the mode control module 124 turns on transistors $Q_1$ and $Q_2$.

The node voltages $N_1$ and $N_2$ may be raised towards B+ in the open tap detection mode when there is an open tap condition. More specifically, if an open tap condition exists at $CT_2$, node $N_1$ is pulled high to B+. In a similar manner, if an open tap condition exists at $CT_1$, node $N_1$ is pulled high to B+. Voltage differences VC1-VC2 and VC2-VC3 may be greater than the threshold voltage when nodes $N_2$ and $N_1$, respectively, increase towards B+. The IC 150 indicates at the output pin CO when node voltages $N_1$ and/or $N_2$ are increased towards B+ due to an open tap condition.

The microcontroller 152 controls the charging module 108 based on the state of the output pin CO and the mode of the system. For example, the microcontroller 152 may instruct the charging module 108 to change an amount of current supplied to the battery pack 104 or stop charging the battery pack 104 when the output pin CO indicates that an overcharging condition and/or an open tap condition exists.

Figure 5:
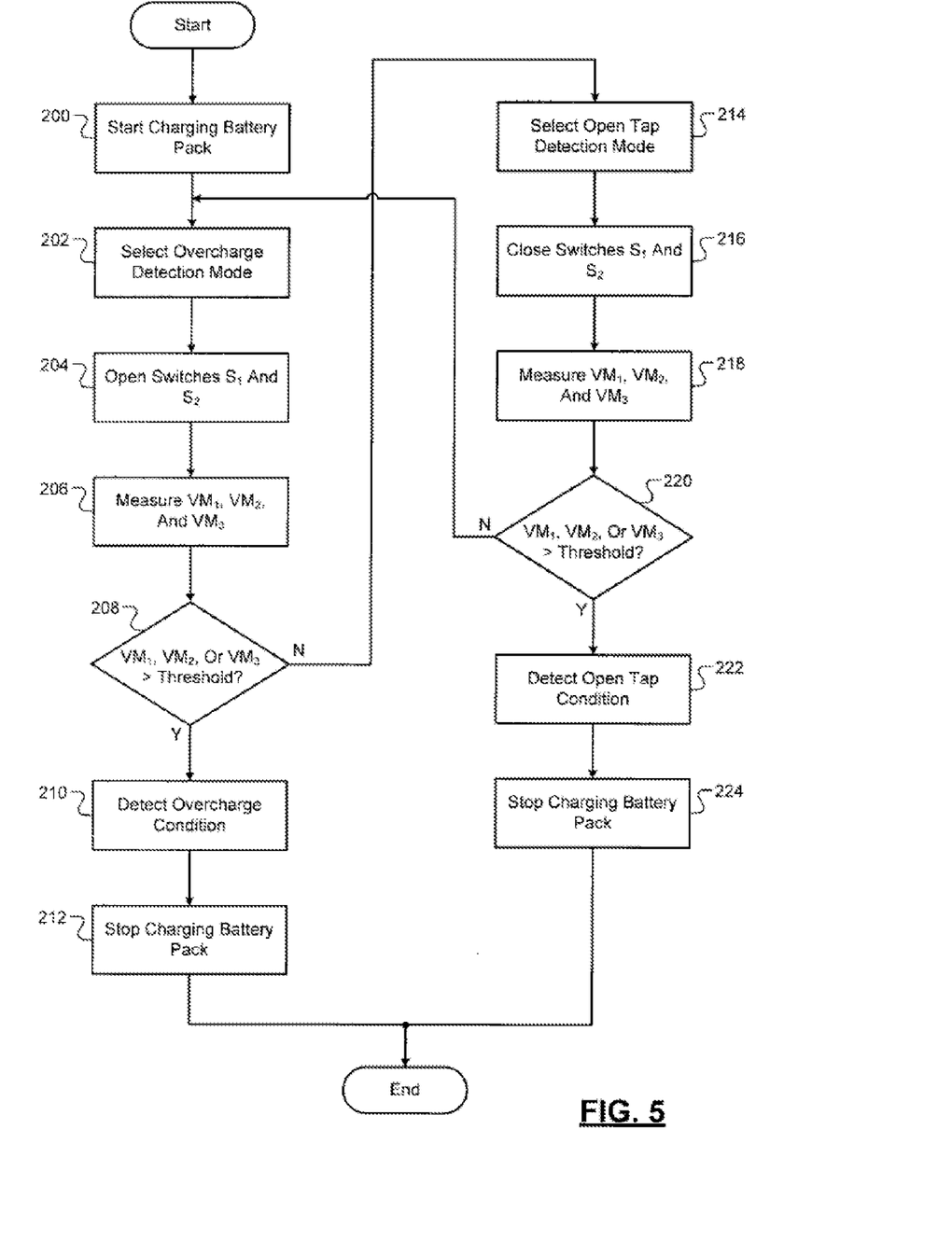
FIG. 5 is a flowchart of a method for detecting overcharging and open tap conditions according to the present disclosure.

Referring now to FIG. 5, a method for detecting overcharging and open tap conditions starts at 200. At 200, a user places the battery pack 104 in the charger 102 and the charging module 108 begins charging the battery pack 104. At 202, the control module 122 selects the overcharge detection mode. At

204, the mode control module 124 opens switches $S_1$ and $S_2$. At 206, the threshold determination modules 120 measure $VM_1$, $VM_2$, and $VM_3$. At 208, the threshold determination modules 120 determine whether $VM_1$, $VM_2$, or $VM_3$ is greater than the threshold voltage. If true, the method continues at 210. If false, the method continues at 214. At 210, the control module 122 detects the overcharging condition. At 212, the charging module 108 stops charging the battery pack 104.

At 214, the control module 122 selects the open tap detection mode. At 216, the mode control module 124 closes switches $S_1$ and $S_2$. At 218, the threshold determination modules 120 measure $VM_1$, $VM_2$, and $VM_3$. At 220, the threshold determination modules 120 determine whether $VM_1$, $VM_2$, or $VM_3$ is greater than the threshold voltage. If true, the method continues at 222. If false, the method continues at 202. At 222, the control module 122 detects the open tap condition. At 224, the charging module 108 stops charging the battery pack 104.

Figure 6:
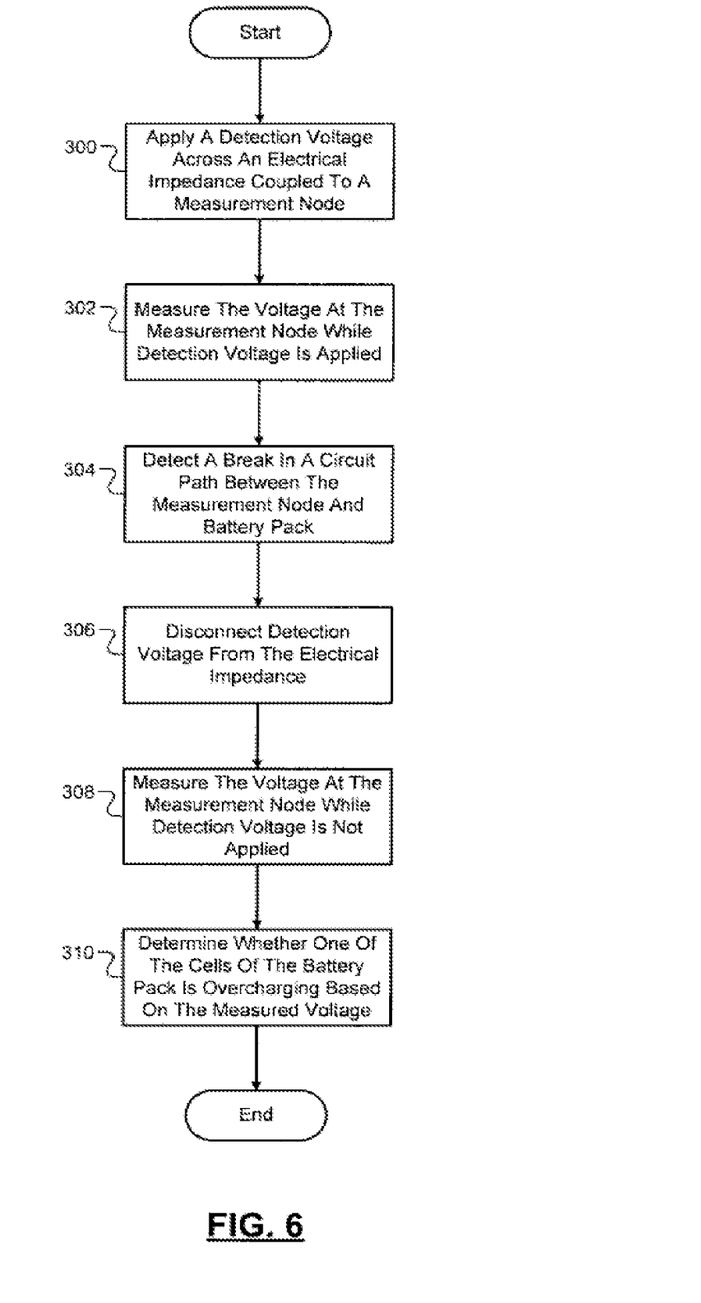
FIG. 6 is a flowchart of a method for detecting an open cell tap condition and an overcharging condition.

Referring now to FIG. 6, an exemplary method for detecting an open cell tap condition and an overcharging condition starts at 300. At 300, control applies a detection voltage (e.g., applies B+ using switch $S_2$) across an electrical impedance (e.g., $R_2$) coupled to a measurement node (e.g., $N_2$). At 302, control measures the voltage at the measurement node while the detection voltage is applied. At 304, control detects a break in a circuit path (e.g., $R_1$ connected between $N_2$ and $CT_1$) between the measurement node and the battery pack 104. At 306, control disconnects the detection voltage from the electrical impedance (e.g., opening the switch $S_2$). At 308, control measures the voltage at the measurement node while the detection voltage is not applied. At 310, control determines whether one of the cells of the battery pack 104 is overcharging based on the measured voltage.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A method for detecting an open cell tap condition in a battery pack having a plurality of battery cells and operably coupled to a battery charger, comprising:

selecting a given inter-cell connection from amongst two or more inter-cell connections that are configured to measure voltage between the plurality of battery cells;

applying, from a positive supply terminal of the battery pack, a detection voltage across an electrical impedance that is coupled to a measurement node, wherein the positive supply terminal of the battery pack is connectable to the electrical impedance, and wherein the measurement node is coupled by the given inter-cell connection to a node disposed between serially coupled battery cells;

measuring, by the battery charger, a voltage at the measurement node;

wherein the steps of selecting, applying and measuring are enabled by closure of only one switch of the battery charger, wherein the one switch connects the positive supply terminal of the battery pack to the measurement node;

detecting, by the battery charger, a break in the given inter-cell connection when the voltage measured at the measurement node is substantially equal to the detection voltage;

opening the one switch;

measuring, by the battery charger, the voltage at the measurement node while the one switch is open; and determining, by the battery charger, that one of the cells of the battery pack is overcharging when the voltage measured at the measurement node is greater than a threshold voltage.

2. The method of claim 1, wherein the electrical impedance is a resistor, and wherein the circuit path includes a resistor connected to the node.

3. The method of claim 1, wherein the battery cells are lithium-ion battery cells.

4. The method of claim 1, further comprising:

closing the switch;

measuring the voltage at the measurement node while the switch is closed; and detecting the break in the circuit path when the voltage measured at the measurement node is greater than the threshold voltage.

5. The method of claim 4, further comprising selectively opening and closing the switch to alternate between determining that one of the cells is overcharging and determining the break in the circuit path, respectively.

6. A battery pack charger that detects whether a terminal of the charger is disconnected from a first node between cells of a battery pack docked in the charger, the charger comprising:

a first resistor connected to the terminal;

a second resistor connected in series with the first resistor;

a switch connected to a positive supply terminal of the battery pack, wherein the switch is connected in series with the first and second resistors;

a mode control module coupled to the switch to select the terminal for a voltage measurement by closing the switch; and a threshold determination module that, in response to the switch being closed, measures a voltage at a second node between the first and second resistors and determines that the terminal of the charger is disconnected from the first node between the cells of the battery pack while the switch is closed and the voltage is greater than a threshold voltage, wherein the threshold determination module determines that one of the cells of the battery pack is overcharging when the switch is open and the voltage at the second node between the first and second resistors is greater than the threshold voltage;

wherein the selection of the terminal for voltage measurement and the voltage measurement are enabled by closure of only the switch.

7. The charger of claim 6, wherein the voltage at the second node between the first and second resistors is substantially equal to the voltage at the positive supply terminal when the switch is closed and the terminal of the charger is disconnected from the first node between the cells of the battery pack.

8. The charger of claim 6, wherein the terminal of the charger is disconnected due to at least one of a disconnection of a terminal of the battery pack from the first node between the cells and a disconnection between the terminal of the charger and a corresponding terminal of the battery pack.

9. The charger of claim 6, wherein the cells of the battery pack are lithium-ion cells.

10. The charger of claim 6, wherein the charger stops charging the battery pack when one of the cells of the battery pack is overcharging, and wherein the charger stops charging the battery pack when the terminal of the charger is disconnected from the first node between the cells of the battery pack.

11. The charger of claim 6, further comprising a mode control module that selectively opens and closes only the switch to alternate between determining whether the one of the cells is overcharging and whether the terminal of the charger is disconnected from the first node between the cells, respectively.

12. The charger of claim 11, wherein the switch is a field effect transistor, and wherein the mode control module selectively applies a voltage to a gate of the field effect transistor to alternate between determining whether the one of the cells is overcharging and whether the terminal of the charger is disconnected from the first node between the cells.

* * * * *